US012609057B2

(12) United States Patent　(10) Patent No.: US 12,609,057 B2
　Park et al.　(45) Date of Patent: Apr. 21, 2026

(54) DISPLAY DEVICE AND METHOD FOR MANUFACTURING SAME, AND MULTI-SCREEN DISPLAY DEVICE USING SAME

(71) Applicant: LG ELECTRONICS INC., Seoul (KR)

(72) Inventors: Sangdae Park, Seoul (KR); Dohyung Lee, Seoul (KR); Sungguk Lee, Seoul (KR); Hwankuk Yuh, Seoul (KR); Jaegwang Um, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 806 days.

(21) Appl. No.: 17/996,211

(22) PCT Filed: Apr. 13, 2020

(86) PCT No.: PCT/KR2020/004996
§ 371 (c)(1),
(2) Date: Oct. 13, 2022

(87) PCT Pub. No.: WO2021/210698
PCT Pub. Date: Oct. 21, 2021

(65) Prior Publication Data
US 2023/0207739 A1　Jun. 29, 2023

(51) Int. Cl.
*G09F 9/302* (2006.01)
*G09F 9/33* (2006.01)
*H01L 25/075* (2006.01)

(52) U.S. Cl.
CPC .............. *G09F 9/3026* (2013.01); *G09F 9/33* (2013.01); *H01L 25/0753* (2013.01)

(58) Field of Classification Search
None
See application file for complete search history.

(56) References Cited

U.S. PATENT DOCUMENTS

2006/0231852 A1　10/2006　Kususe et al.
2015/0214194 A1　7/2015　Yan
(Continued)

FOREIGN PATENT DOCUMENTS

JP　　2005-039284　　2/2005
KR　10-2005-0026551　3/2005
(Continued)

OTHER PUBLICATIONS

Korean Intellectual Property Office Application No. 10-2022-7038629, Office Action dated Apr. 29, 2024, 5 pages.
(Continued)

*Primary Examiner* — Bo B Jang
(74) *Attorney, Agent, or Firm* — LEE, HONG, DEGERMAN, KANG & WAIMEY

(57)　ABSTRACT

A display device according to an embodiment of the present invention includes a first substrate, a plurality of semiconductor light emitting devices disposed in an array form on an upper surface of the first substrate, a first wiring electrode formed on the upper surface of the first substrate and electrically connected to the plurality of semiconductor light emitting devices, a first electrode pad formed in an area including an upper edge of the first substrate and connected to the first wiring electrode and a side electrode formed on a side surface of the first substrate and having one end in contact with a side surface of the first electrode pad. And a thickness of the first electrode pad can be greater than a thickness of the first wiring electrode.

17 Claims, 12 Drawing Sheets

(56) References Cited

U.S. PATENT DOCUMENTS

| | | |
|---|---|---|
| 2016/0190396 A1 | 6/2016 | Lee et al. |
| 2020/0105729 A1 | 4/2020 | Nakabayashi et al. |
| 2020/0203235 A1* | 6/2020 | Jung ..................... H10D 86/60 |

FOREIGN PATENT DOCUMENTS

| | | |
|---|---|---|
| KR | 10-2016-0079276 | 7/2016 |
| KR | 1020200004751 | 1/2020 |
| KR | 1020200008433 | 1/2020 |
| KR | 1020200026769 | 3/2020 |
| WO | 2019079253 | 4/2019 |

OTHER PUBLICATIONS

PCT International Application No. PCT/KR2020/004996, International Search Report dated Mar. 8, 2021, 2 pages.
Korean Intellectual Property Office Application No. 10-2022-7038629, Notice of Allowance dated Jan. 8, 2025, 1 page.

* cited by examiner

[FIG. 1]
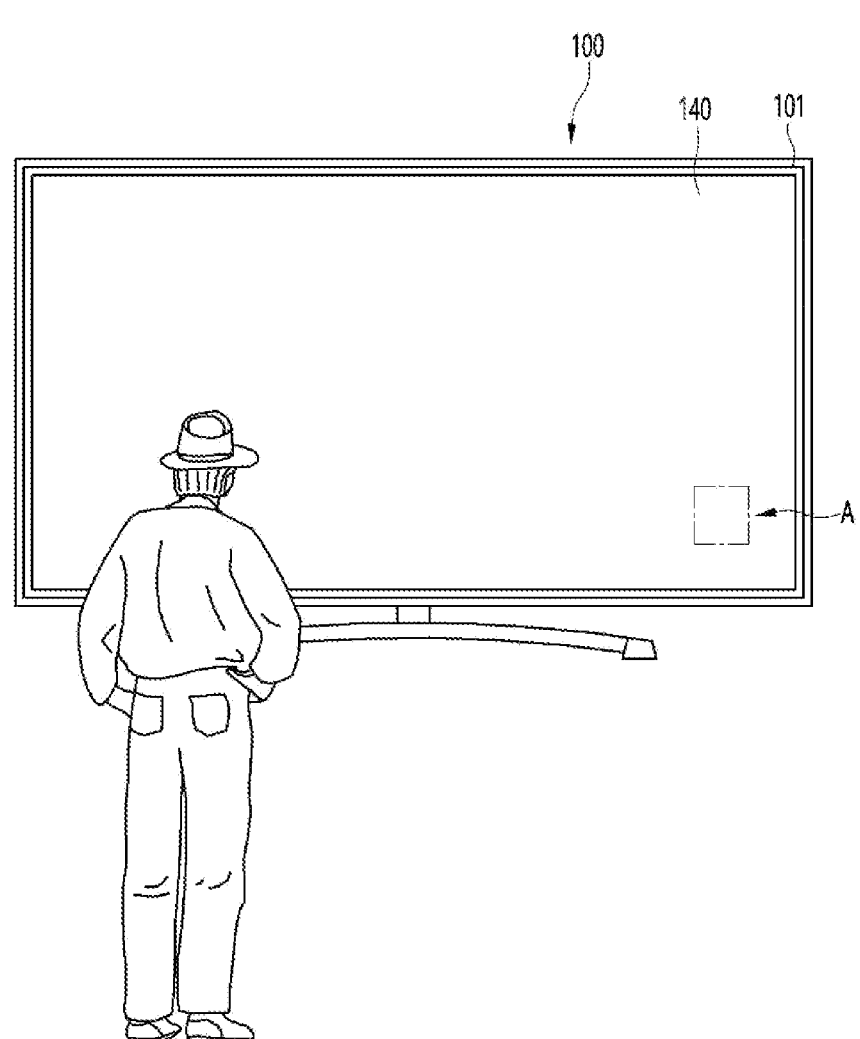

[FIG. 2]
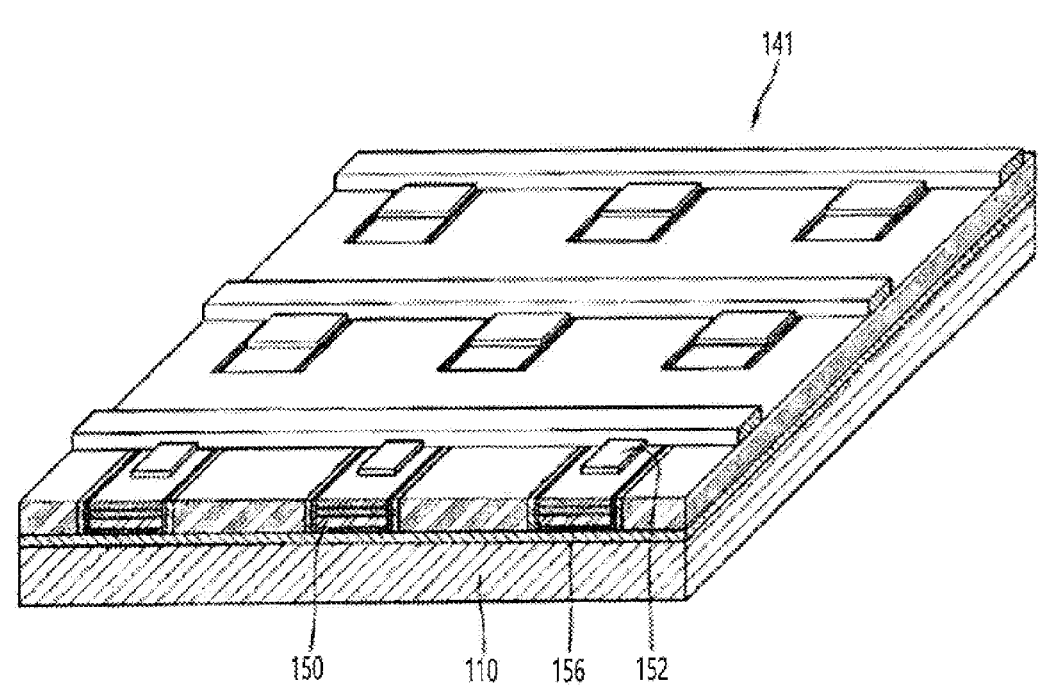
[FIG. 3]
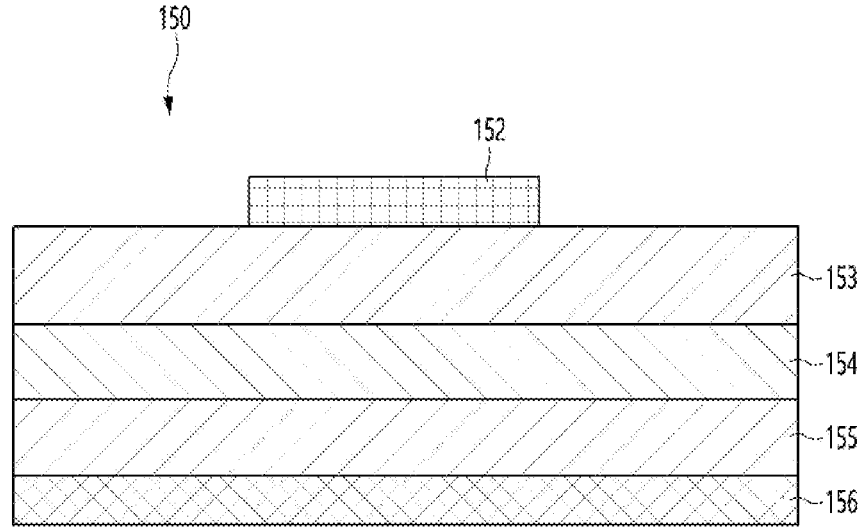

[FIG. 4]
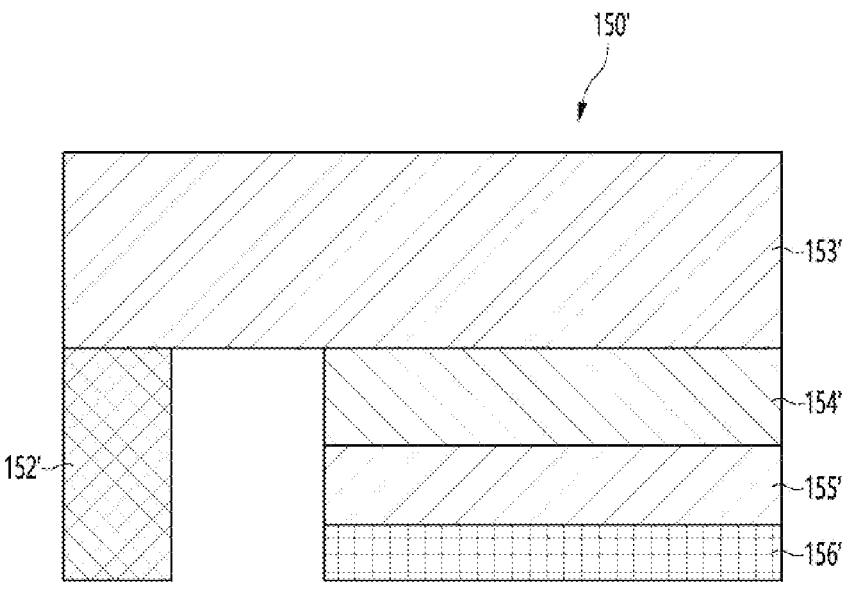
[FIG. 5a]
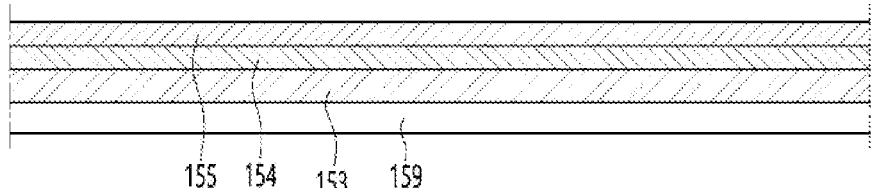
[FIG. 5b]
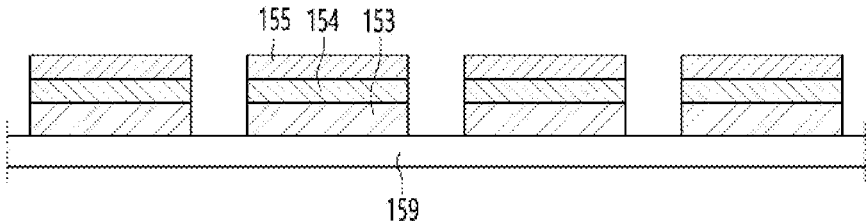
[FIG. 5c]
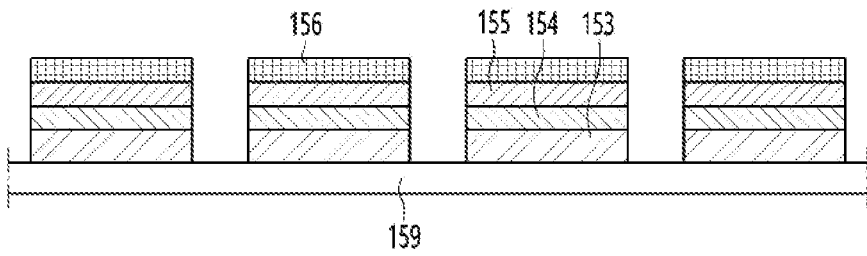

[FIG. 5d]
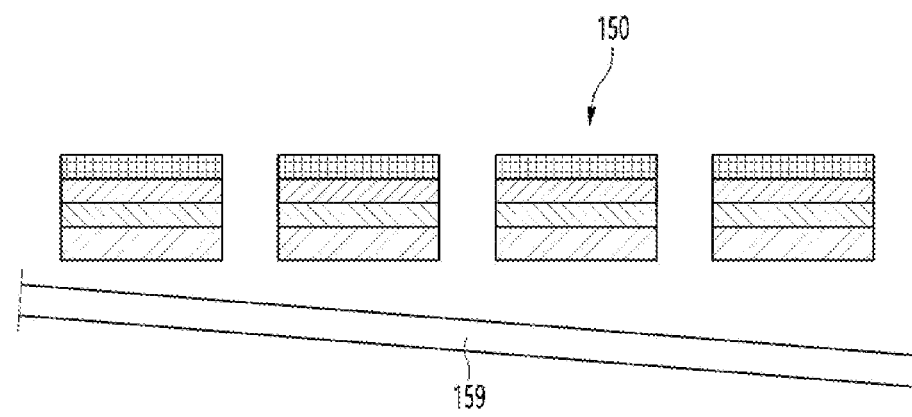
[FIG. 6]
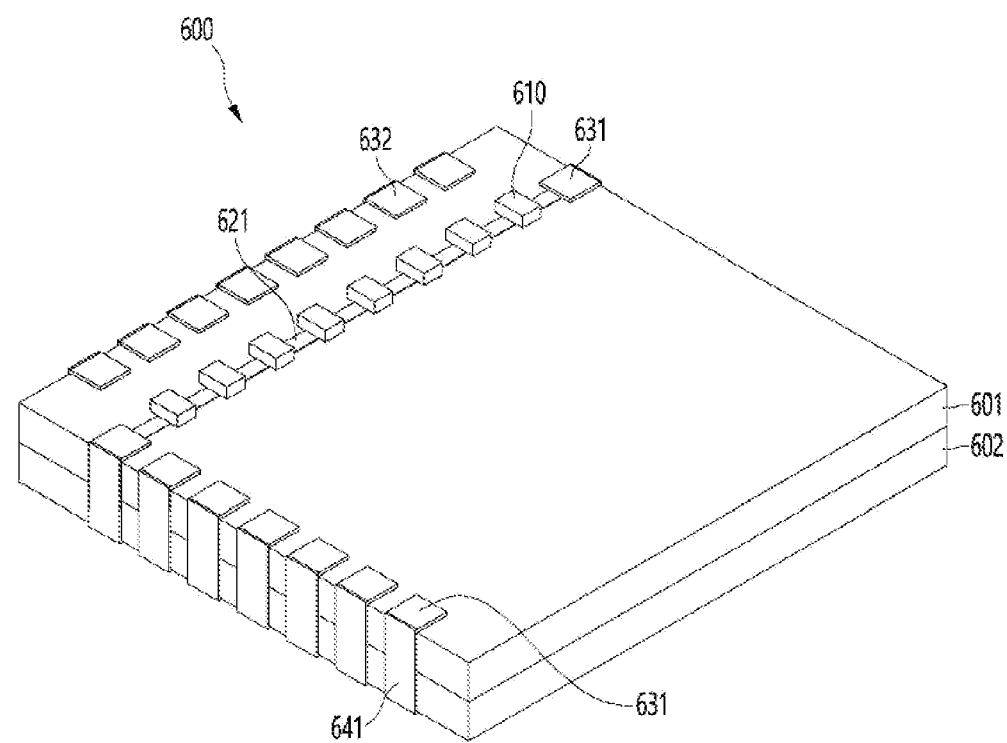

[FIG. 7]
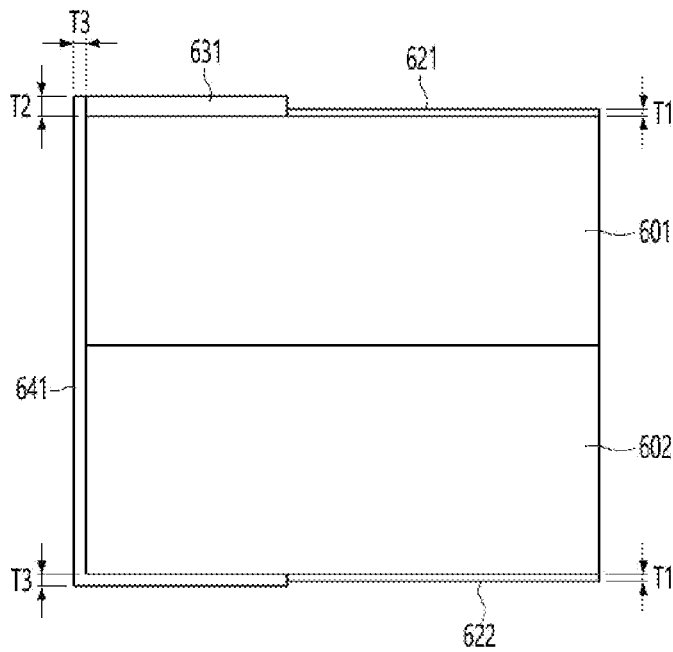
[FIG. 8a]
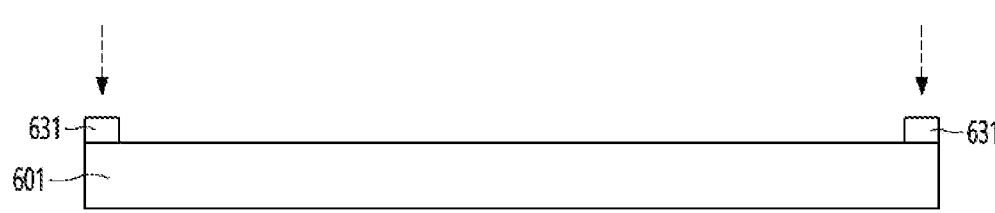
[FIG. 8b]
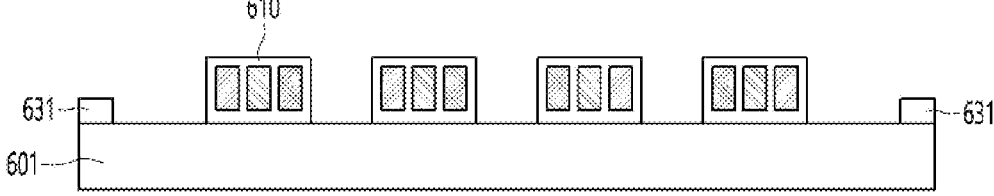

[FIG. 8c]
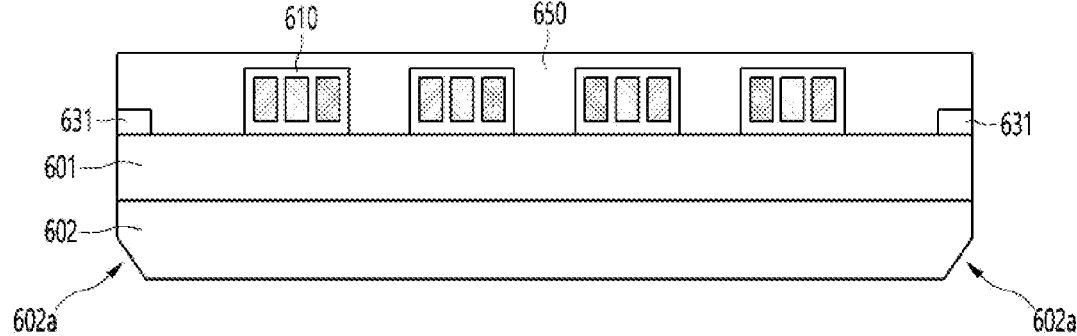
[FIG. 8d]
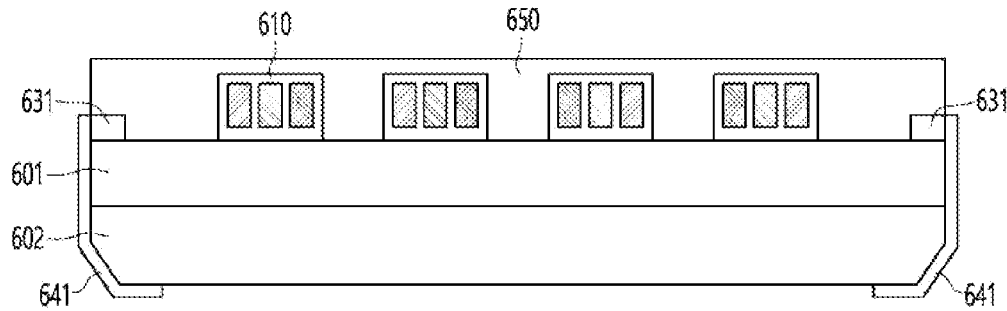
[FIG. 8e]
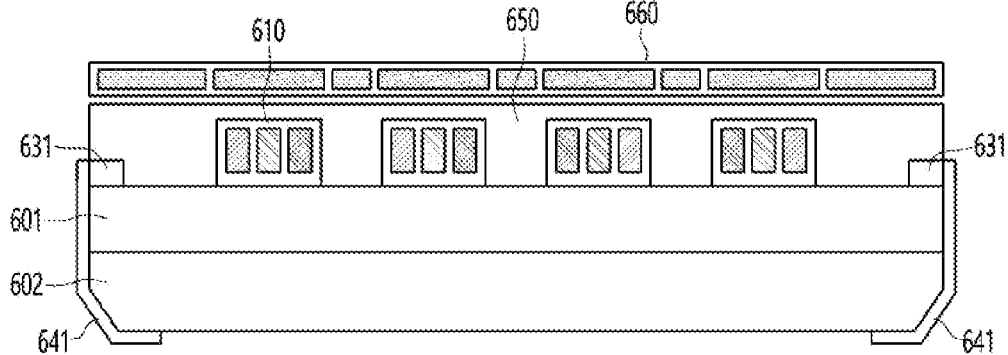

[FIG. 9]
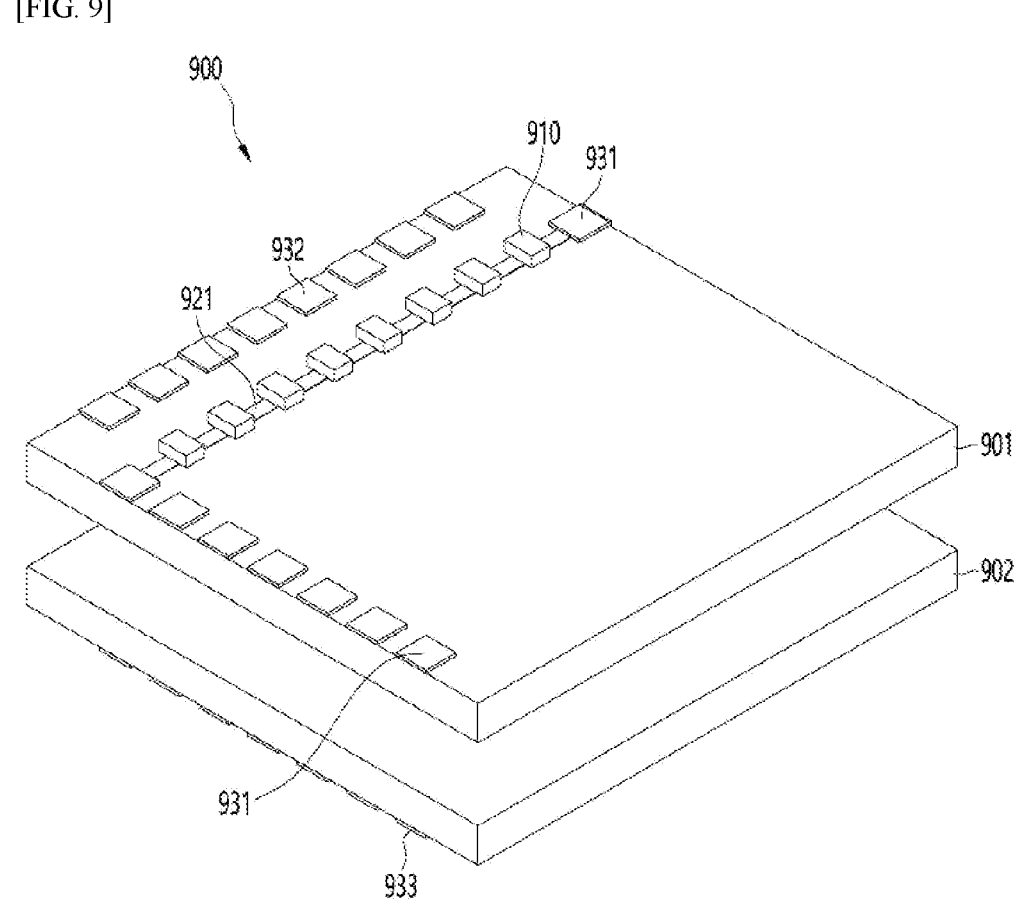

[FIG. 10]
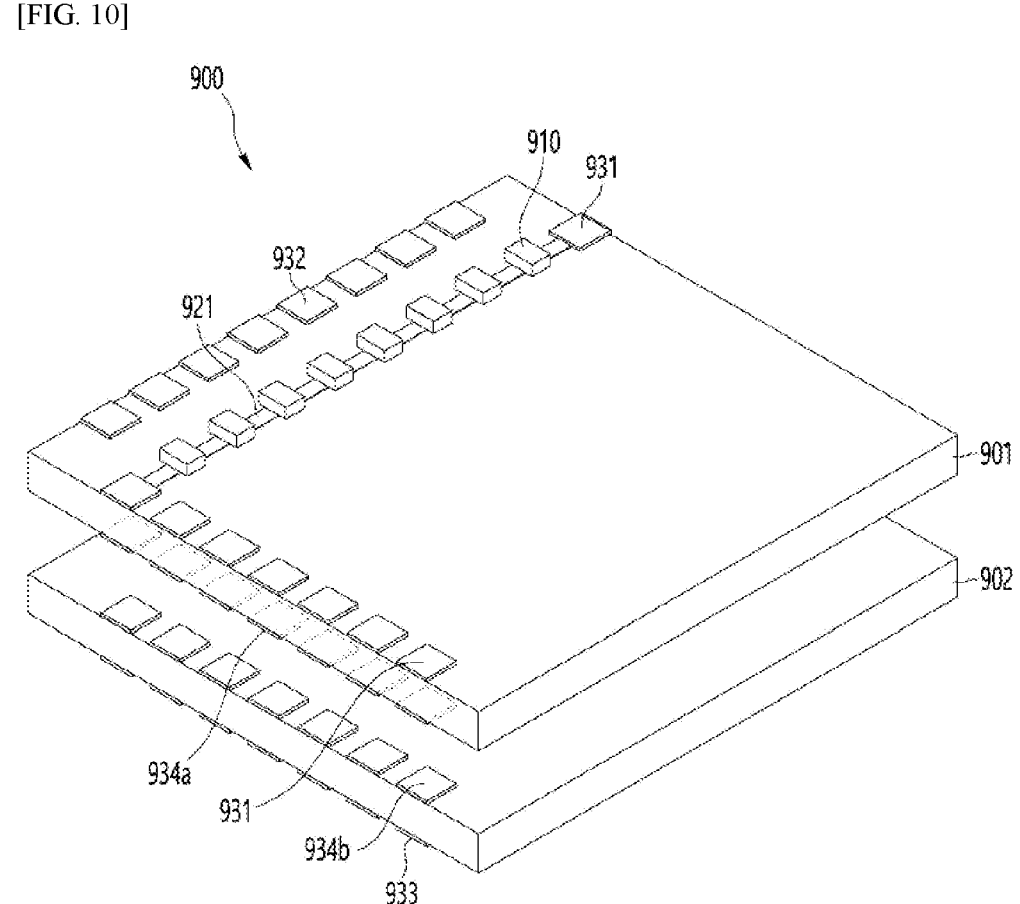

[FIG. 11]
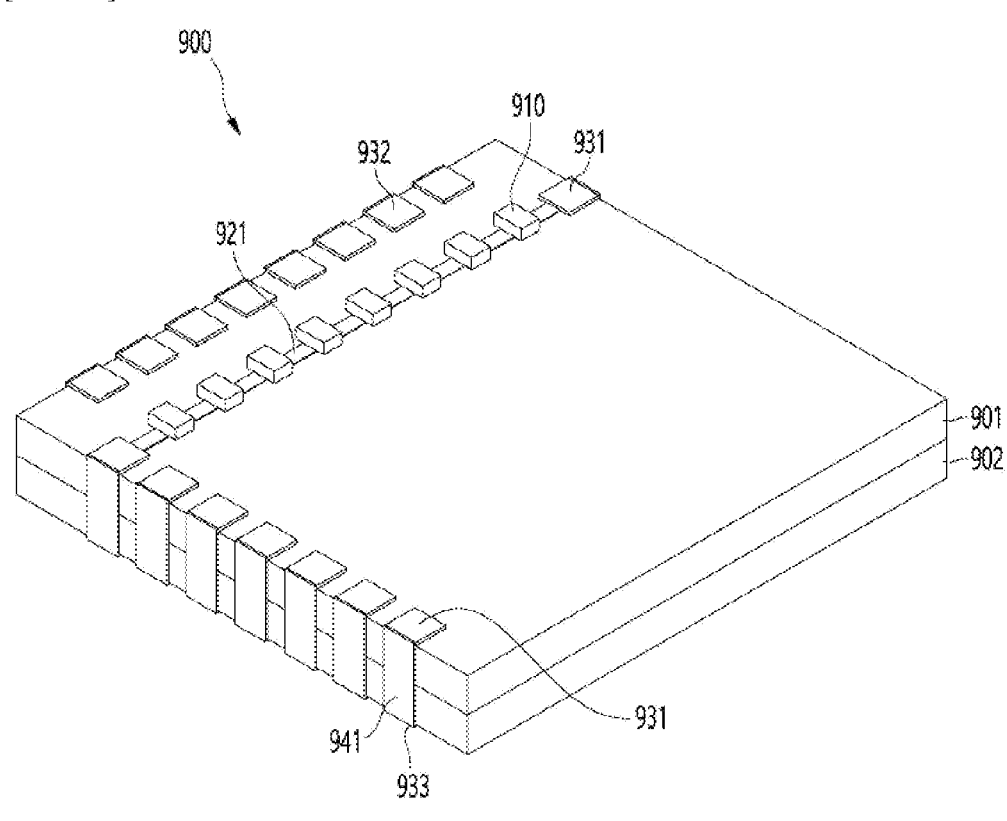
[FIG. 12]
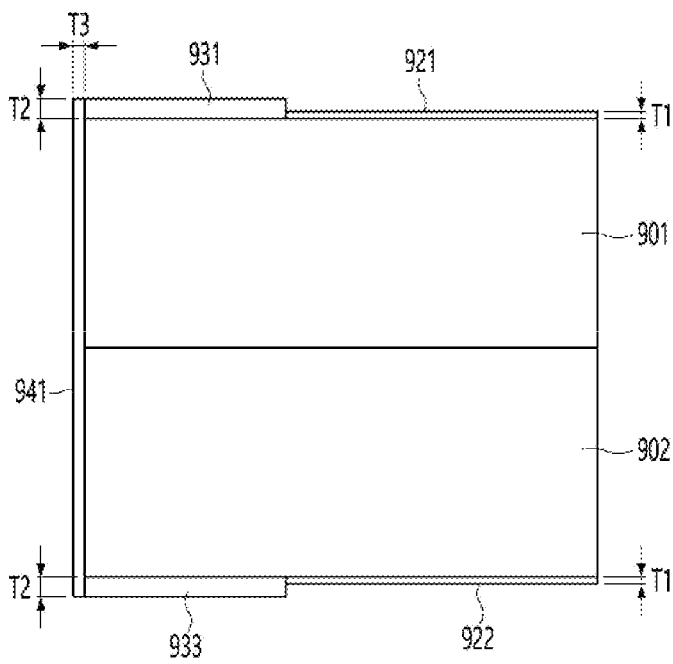

[FIG. 13]
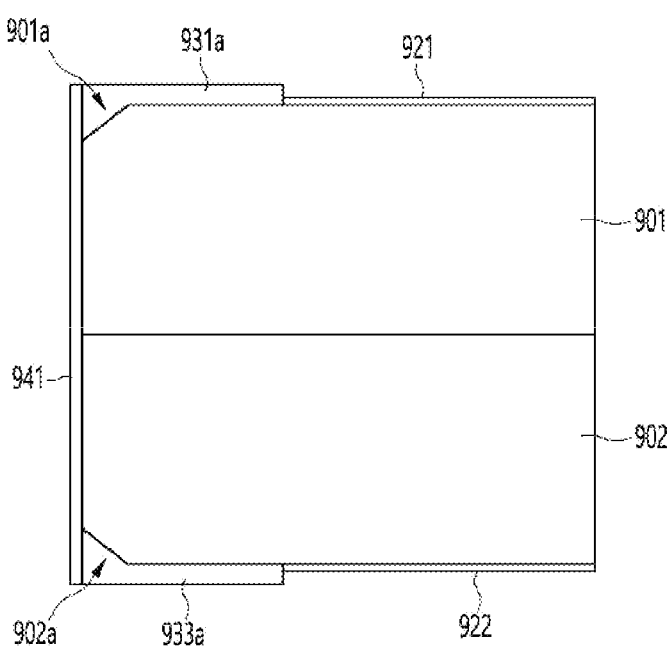
[FIG. 14a]
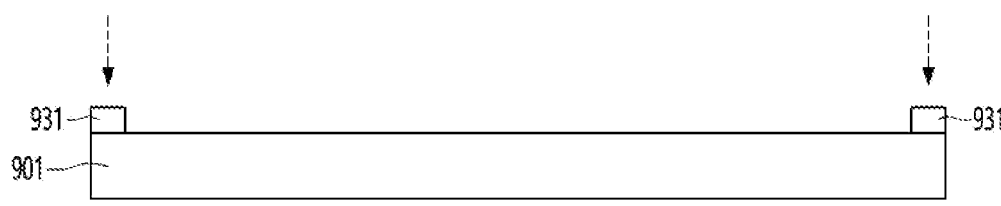
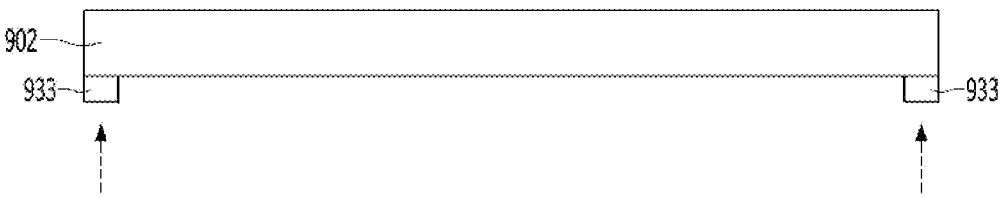

[FIG. 14b]
[FIG. 14c]
[FIG. 14d]
[FIG. 14e]
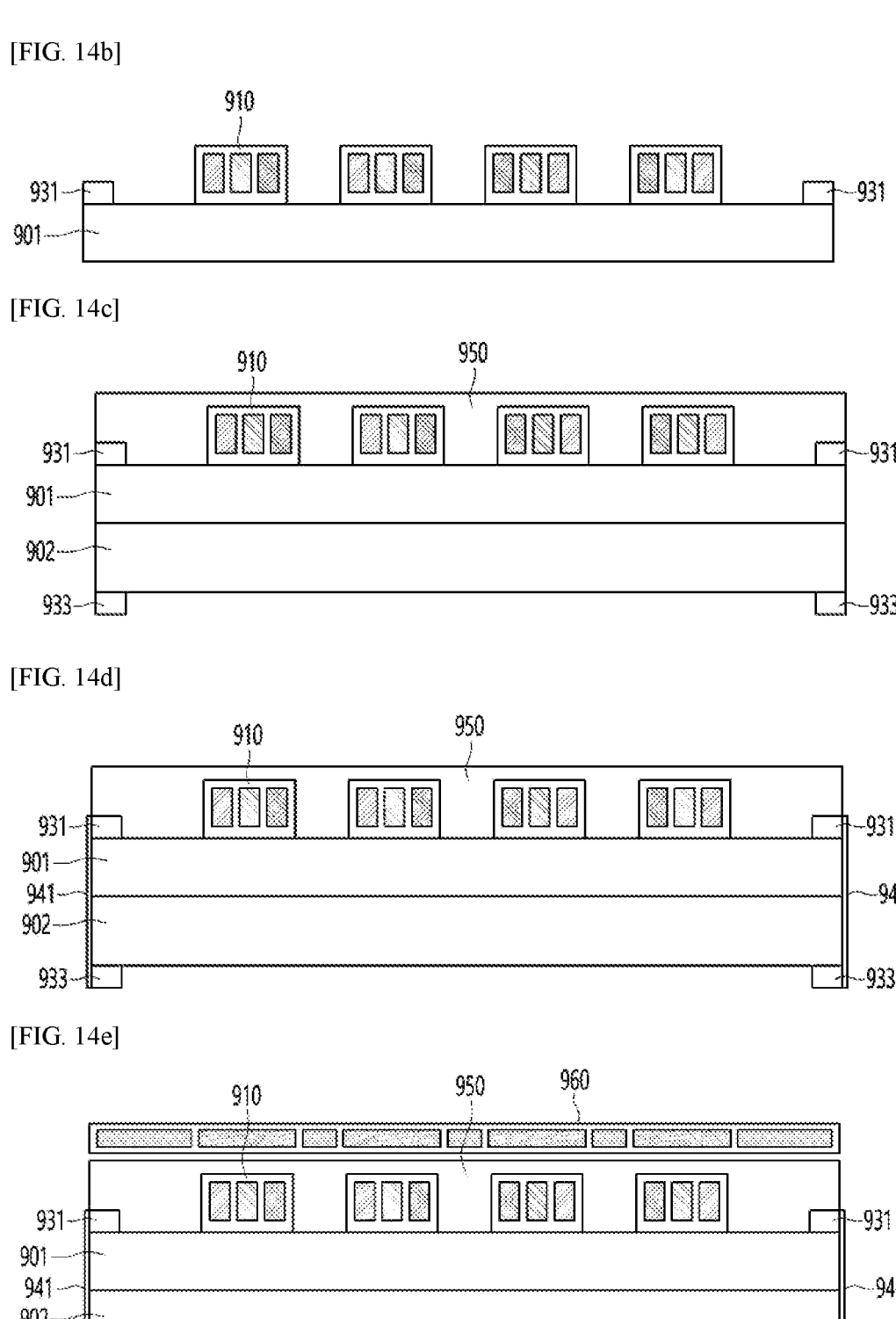

[FIG. 15]
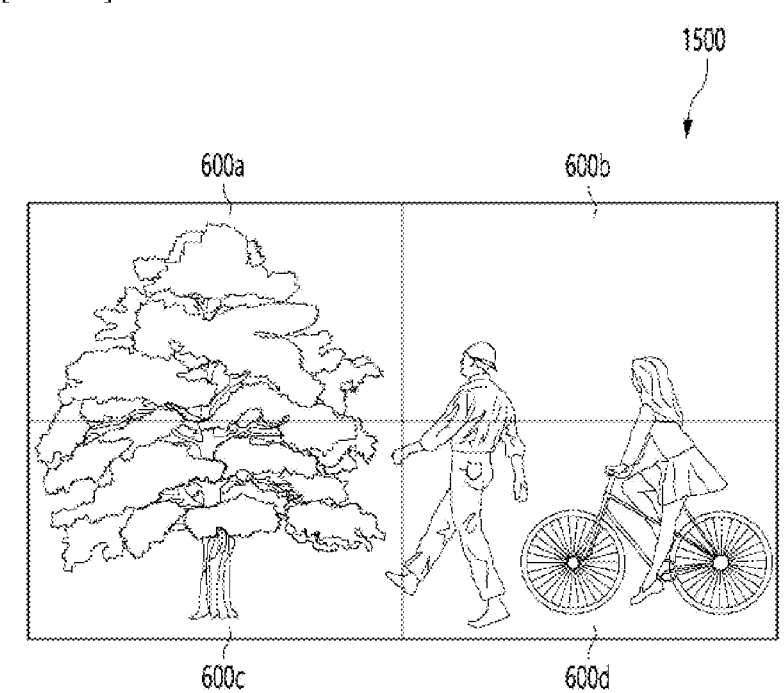

DISPLAY DEVICE AND METHOD FOR MANUFACTURING SAME, AND MULTI-SCREEN DISPLAY DEVICE USING SAME

CROSS-REFERENCE TO RELATED APPLICATION(S)

This application is the National Stage filing under 35 U.S.C. 371 of International Application No. PCT/KR2020/004996, filed on Apr. 13, 2020, the contents of which are all incorporated by reference herein in its entirety.

TECHNICAL FIELD

The present invention relates to a display device, a manufacturing method thereof, and a multi-screen display device using the same.

BACKGROUND ART

Recently, in the field of display technology, display devices having excellent characteristics such as thinness and flexibility have been developed. On the other hand, currently commercialized main displays are represented by LCD (Liguid Crystal Display) and AMOLED (Active Matrix Organic Light Emitting Diodes).

However, in the case of LCD, there are problems in that the response time is not fast and it is difficult to implement flexible, and in the case of AMOLED, there are weaknesses in that the lifespan is short and the mass production yield is not good.

On the other hand, a light emitting diode (Light Emitting Diode: LED) is a well-known semiconductor light emitting device that converts electric current into light, the light emitting diodes have been used as light sources for display images of electronic devices including information and communication devices, along with GaP:N-based green LEDs, starting with the commercialization of red LEDs using GaAsP compound semiconductors in 1962. Accordingly, a method for solving the above problems by implementing a display using the semiconductor light emitting device can be proposed. Such a light emitting diode has various advantages, such as a long lifespan, low power consumption, excellent initial driving characteristics, and high vibration resistance, compared to a filament-based light emitting device.

In particular, recently, research and development on a display device using a semiconductor light emitting device having a diameter or cross-sectional area of about 100 micrometers or less has been conducted, and since such a display device has high image quality and high reliability, it is in the spotlight as a next-generation display.

However, the conventional display device using a semiconductor light emitting device is manufactured by transferring the semiconductor light emitting device to a substrate such as a TFT substrate or a wiring substrate, there is a problem in that productivity is lowered due to a transfer defect rate of the semiconductor light emitting device, and in particular, a production yield of a large-area display device is extremely low. In order to solve this problem, recently, research and development of a multi-screen display device that implements a large display device by connecting a plurality of semiconductor light emitting device display devices having a relatively small size has been conducted.

However, in the case of a multi-screen display device, a gap area in which no pixel exists between the unit display devices connected to each other occurs due to the bezel area of each of the unit display devices. Such a gap area may give a sense of disconnection and difference when displaying one image in the entire area of the multi-screen display device, thereby reducing immersion in the image.

DISCLOSURE

Technical Problem

A problem of the present invention is to provide a display device capable of minimizing the bezel area of each of the display devices constituting the multi-screen display device, and a multi-screen display device using the same.

Another problem to be solved by the present invention is to provide a display device that minimizes the defect rate of side electrodes for electrical connection between an upper substrate and a lower substrate, and a multi-screen display device using the same.

Technical Solution

A display device according to an embodiment of the present invention can include a first substrate and a plurality of semiconductor light emitting devices arranged in an array form on an upper surface of the first substrate, a first wiring electrode formed on an upper surface of the first substrate, electrically connected to the plurality of semiconductor light emitting devices, a first electrode pad formed in an area including an upper edge of the first substrate and connected to the first wiring electrode and a side electrode formed on a side surface of the first substrate and having one end in contact with a side surface of the first electrode pad, and a thickness of the first electrode pad can be greater than a thickness of the first wiring electrode.

According to an embodiment, the thickness of the side electrode can be thinner than the thickness of the first electrode pad, and can be less than or equal to the thickness of the first wiring electrode.

According to an embodiment, the display device can further include a second wiring electrode formed on a lower surface of the first substrate or a lower surface of a second substrate coupled to the lower surface of the first substrate.

The other end of the side electrode is connected to the second wiring electrode, between the one end and the other end of the side electrode, a bending area based on a lower edge of the first substrate or the second substrate can be formed.

According to an embodiment, the display device further includes a second electrode pad formed in an area including a lower surface edge of the first substrate or the second substrate and connected between the second wiring electrode and the side electrode and a thickness of the second electrode pad can be greater than a thickness of the second wiring electrode.

The other end of the side electrode can be in contact with the side surface of the second electrode pad, and the side electrode can have a flat plate shape. The length of the side electrode can be equal to or greater than a sum of the thickness of the first electrode pad, a thickness of the first substrate, a thickness of the second substrate, and a thickness of the second electrode pad.

According to an embodiment, the thickness of the side electrode can be thinner than the thickness of the first electrode pad and the thickness of the second electrode pad.

According to an embodiment, the display device further includes an auxiliary electrode pad formed in an area including a lower surface edge of the first substrate or an area including an upper surface edge of the second substrate and the side electrode can be in contact with a side surface of the auxiliary electrode pad.

The method of manufacturing a display device according to an embodiment of the present invention can include forming a first electrode pad connected to the first wiring electrode formed on the upper surface of the first substrate in an area including the upper surface edge of the first substrate; and forming a side electrode in contact with a side surface of the first substrate and a side surface of the electrode pad and the thickness of the first electrode pad can be greater than the thickness of the first wiring electrode.

The multi-screen display device according to an embodiment of the present invention can include a plurality of tiled display devices.

Advantageous Effects

According to an embodiment of the present invention, since the thickness can be reduced when the side electrode is formed, the size of the bezel area of the display device can be effectively reduced compared to the related art.

Also, after an electrode pad having a thickness greater than that of the wiring electrode is previously formed on the substrate, the side electrode is connected to the side surface of the electrode pad, thereby increasing the contact area between the electrode pad and the side electrode. Accordingly, a connection failure can be minimized during electrical connection between the upper and lower portions of the substrate.

Besides, according to the method of manufacturing a display device of the present invention, since the upper and lower portions of the substrate can be electrically connected only by the process of connecting the flat side electrode between the first electrode pad formed on the upper portion of the substrate and the second electrode pad formed on the lower portion of the substrate, it is possible to effectively reduce the process difficulty.

Also, since the side bezel area of each of the plurality of display devices according to an embodiment of the present invention can be minimized, a gap area with an adjacent display device can be effectively reduced. As the gap area is reduced, a dark area generated by the gap area can be minimized or removed when an image is output, and accordingly, an image with a minimized sense of disconnection can be displayed on the entire screen of the multi-screen display device.

DESCRIPTION OF DRAWINGS

FIG. 1 is a conceptual diagram illustrating a display device including a semiconductor light emitting device as an embodiment of a display device of the present invention.

FIG. 2 is an enlarged view of part A of the display device of FIG. 1.

FIG. 3 is an enlarged view of the semiconductor light emitting device of FIG. 2.

FIG. 4 is an enlarged view showing another embodiment of the semiconductor light emitting device of FIG. 2.

FIGS. 5A to 5D are conceptual views for explaining an example of a manufacturing process of the above-described semiconductor light emitting device.

FIG. 6 is a perspective view schematically illustrating a display device according to an embodiment of the present invention.

FIG. 7 is a side view of an edge area of the display device according to the embodiment of FIG. 6.

FIGS. 8A to 8E are views for explaining an embodiment of a manufacturing process of the display device shown in FIG. 6.

FIGS. 9 to 11 are perspective views schematically showing a display device according to other embodiments of the present invention.

FIGS. 12 to 13 are side views of an edge area of the display device according to the embodiment of FIG. 9.

FIGS. 14A to 14E are diagrams for explaining an embodiment of a manufacturing process of the display device shown in FIG. 9.

FIG. 15 shows a multi-screen display device including a plurality of display devices according to an embodiment of the present invention.

MODE FOR INVENTION

Hereinafter, the embodiments disclosed in the present specification will be described in detail with reference to the accompanying drawings, but the same or similar components are given the same reference sign regardless of the reference numerals, and the redundant description thereof will be omitted. The suffixes "module" and "part" for components used in the following description are given or mixed in consideration of only the ease of writing the specification, and do not have a meaning or role distinct from each other by themselves. Also, in describing the embodiments disclosed in the present specification, if it is determined that detailed descriptions of related known technologies may obscure the gist of the embodiments disclosed in the present specification, the detailed description thereof will be omitted. Also, the attached drawings are only for easy understanding of the embodiments disclosed in the present specification, and should not be construed as limiting the technical idea disclosed herein by the attached drawings.

Also, when an element such as a layer, area or substrate is referred to as being "on" another component, it will be understood that this can be directly on other elements or intervening elements may exist in between.

A display device described in this specification can include a mobile phone, a smart phone, a laptop computer, a digital broadcasting terminal, a personal digital assistant (PDA), a portable multimedia player (PMP), a navigation system, a slate PC, a Tablet PC, an Ultra Book, a digital TV, a digital signage, a head mounted display (HMD), a desktop computer, and the like. However, it will be readily apparent to those skilled in the art that the configuration according to the embodiment described herein can be applied to a display capable device even in a new product form to be developed later.

FIG. 1 is a conceptual diagram illustrating an embodiment of a display device using a semiconductor light emitting device of the present invention, and FIG. 2 is an enlarged view of part A of the display device of FIG. 1. FIG. 3 is an enlarged view of the semiconductor light emitting device of FIG. 2, and FIG. 4 is an enlarged view illustrating another embodiment of the semiconductor light emitting device of FIG. 2.

According to the city, information processed by the control unit of the display device 100 can be output through the display module 140. A closed-loop case 101 surrounding the edge of the display module 140 can form a bezel of the display device 100.

The display module 140 can include a panel 141 on which an image is displayed, and the panel 141 can include a semiconductor light emitting device 150 and a wiring substrate 110 on which the semiconductor light emitting device 150 is mounted. The semiconductor light emitting device 150 can include a mini LED having a diameter or cross-sectional area of about 100 micrometers or a micro-LED having a size smaller than that.

A wiring is formed on the wiring substrate 110 to be connected to the n-type electrode 152 and the p-type electrode 156 of the semiconductor light emitting device 150. Through this, the semiconductor light emitting device 150 can be provided on the wiring substrate 110 as individual pixels that emit light.

The image displayed on the panel 141 is visual information, and is implemented by independently controlling the light emission of sub-pixels arranged in a matrix form through the wiring.

In the present invention, a micro-LED (Light Emitting Diode) (or mini LED) is exemplified as a type of the semiconductor light emitting device 150 that converts electric current into light. The micro-LED can be a light emitting diode formed in a small size of 100 micro or less. In the semiconductor light emitting device 150, blue, red, and green colors are respectively provided in the light emitting area, and a unit pixel can be implemented by a combination thereof. That is, the unit pixel means a minimum unit for implement one color, and at least three micro-LEDs can be provided in the unit pixel.

More specifically, referring to FIG. 3, the semiconductor light emitting device 150 can have a vertical structure.

For example, the semiconductor light emitting device 150 can be implemented as a high output light emitting device that emits various types of light, including blue, by using gallium nitride (GaN) as a main component and adding indium (In) and/or aluminum (Al) together.

Such a vertical semiconductor light emitting device includes a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the lower p-type electrode 156 can be electrically connected to the p-electrode of the wiring substrate, and the upper n-type electrode 152 can be electrically connected to the n-electrode at the upper side of the semiconductor light emitting device. The vertical semiconductor light emitting device 150 has a great advantage in that the size of a chip can be reduced because electrodes can be arranged up and down.

As another example, referring to FIG. 4, the semiconductor light emitting device can be a flip chip type light emitting device.

As an example, the semiconductor light emitting device 150' includes a p-type electrode 156', a p-type semiconductor layer 155' on which the p-type electrode 156' is formed, the active layer 154' formed on the p-type semiconductor layer 155', the n-type semiconductor layer 153' formed on the active layer 154', and an n-type electrode 152' formed under the n-type semiconductor layer 153' and spaced apart from the p-type electrode 156' in the horizontal direction. In this case, both the p-type electrode 156' and the n-type electrode 152' can be electrically connected to the p-electrode and the n-electrode of the wiring substrate under the semiconductor light emitting device.

The vertical semiconductor light emitting device and the horizontal semiconductor light emitting device can be a green semiconductor light emitting device, a blue semiconductor light emitting device, or a red semiconductor light emitting device, respectively. In the case of the green semiconductor light emitting device and the blue semiconductor light emitting device, Gallium nitride (GaN) can be mainly used, and indium (In) and/or aluminum (Al) can be added together, high-output light emitting devices emitting green light or blue light can be implemented. For this example, the semiconductor light emitting device can be a gallium nitride thin film formed in various layers such as n-Gan, p-Gan, AlGaN, InGan, etc. Specifically, the p-type semiconductor layer can be P-type GaN, and the n-type semiconductor layer can be N-type GaN. However, in the case of a red semiconductor light emitting device, the p-type semiconductor layer can be P-type GaAs, and the n-type semiconductor layer can be N-type GaAs.

Also, the p-type semiconductor layer can be P-type GaN doped with Mg on the p-electrode side, and the n-type semiconductor layer can be N-type GaN doped with Si on the n-electrode side. In this case, the above-described semiconductor light emitting devices can be semiconductor light emitting devices without an active layer.

Meanwhile, referring to FIGS. 1 to 4, since the light emitting diode is very small, unit pixels that emit self-luminescence can be arranged in a high definition in the display panel, thereby implementing a high-definition display device.

In the display device using the semiconductor light emitting device of the present invention described above, the semiconductor light emitting device grown on a wafer and formed through mesa and isolation is used as an individual pixel. In this case, the micro-sized semiconductor light emitting device 150 can be transferred from the wafer to a preset position on the substrate of the display panel. As such a transfer technology, there are technologies such as pick and place, stamp transfer, roll transfer, fluidic assembly, and laser transfer.

FIGS. 5A to 5D are conceptual views for explaining an example of a manufacturing process of the above-described semiconductor light emitting device.

In this specification, a display device using a passive matrix (PM) type semiconductor light emitting device is exemplified. However, the examples described below are also applicable to an active matrix (AM) type semiconductor light emitting device.

First, according to the manufacturing method, the first conductivity type semiconductor layer 153, the active layer 154, and the second conductivity type semiconductor layer 155 can be grown on the growth substrate 159, respectively (FIG. 5A).

When the first conductivity type semiconductor layer 153 is grown, next, an active layer 154 is grown on the first conductivity type semiconductor layer 153, next, a second conductivity type semiconductor layer 155 is grown on the active layer 154. In this way, when the first conductivity type semiconductor layer 153, the active layer 154, and the second conductivity type semiconductor layer 155 can be sequentially grown, as shown in FIG. 5A, the first conductivity type semiconductor layer 153, the active layer 154, and the second conductivity type semiconductor layer 155 can form a stacked structure.

In this case, the first conductivity type semiconductor layer 153 can be a p-type semiconductor layer, and the second conductivity type semiconductor layer 155 can be an n-type semiconductor layer. However, the present invention is not necessarily limited thereto, and examples in which the first conductivity type is n-type and the second conductivity type is p-type are also possible.

Also, although the present embodiment exemplifies the case in which the active layer is present, a structure in which the active layer is not present is also possible in some cases as described above. For this example, the p-type semiconductor layer can be P-type GaN doped with Mg, and the n-type semiconductor layer can be N-type GaN doped with Si on the n-electrode side.

The growth substrate 159 (wafer) can be formed of a material having a light-transmitting property, for example, any one of sapphire ($Al_2O_3$), GaN, ZnO, and AlO, but is not limited thereto. Also, the growth substrate 1059 can be formed of a material suitable for semiconductor material growth, a carrier wafer. It can be formed of a material having excellent thermal conductivity, including a conductive substrate or an insulating substrate. For example, at least one of Si, GaAs, GaP, InP, and $Ga_2O_3$ or a SiC substrate having higher thermal conductivity than a sapphire ($Al_2O_3$) substrate can be used.

Next, at least some portions of the first conductivity type semiconductor layer 153, the active layer 154, and the second conductivity type semiconductor layer 155 are removed to form a plurality of semiconductor light emitting devices (refer to FIG. 5B).

More specifically, an isolation can be performed so that a plurality of light emitting devices form a light emitting device array. That is, the first conductivity type semiconductor layer 153, the active layer 154, and the second conductivity type semiconductor layer 155 can be vertically etched to form a plurality of semiconductor light emitting devices.

If a horizontal type semiconductor light emitting device is formed, the active layer 154 and the second conductivity type semiconductor layer 155 are partially removed in the vertical direction, so the first conductivity type semiconductor layer 153 is exposed to the outside in a mesa process, thereafter, isolation of forming a plurality of semiconductor light emitting device arrays by etching the first conductivity type semiconductor layer can be performed.

Next, second conductive electrodes 156 (or p-type electrodes) are respectively formed on one surface of the second conductivity type semiconductor layer 155 (refer to FIG. 5C). The second conductive electrode 156 can be formed by a deposition method such as sputtering, but the present invention is not limited thereto. However, when the first conductivity type semiconductor layer and the second conductivity type semiconductor layer are an n-type semiconductor layer and a p-type semiconductor layer respectively, the second conductive electrode 156 can be an n-type electrode.

Next, the growth substrate 159 can be removed to provide a plurality of semiconductor light emitting devices. For example, the growth substrate 1059 can be removed using a laser lift-off (LLO) method or a chemical lift-off (CLO) method (refer to FIG. 5D). The plurality of semiconductor light emitting devices separated as the growth substrate 159 is removed can be transferred to the substrate according to the above-described transfer technique.

Meanwhile, the display device using the above-described semiconductor light emitting device can be manufactured by transferring the semiconductor light emitting devices to a substrate such as a TFT (Thin Film Transistor) substrate or a wiring substrate. However, since a semiconductor light emitting device having a fine size is directly transferred to a substrate, it can take an excessive amount of time to manufacture a large-area display device. Also, due to the transfer difficulty, a defect rate can increase when transferring to a large-area substrate, and defects can occur depending on the yield of the semiconductor light emitting device itself. That is, the productivity of the large area display device can be lower than that of other types of display devices.

To solve these problems, recently, research and development on a multi-screen display device that implements a large display device by connecting a plurality of semiconductor light emitting device display devices (unit display devices) having a relatively small size is being conducted.

However, in the case of a multi-screen display device, a gap area in which no pixels exist between the unit display devices connected to each other can occur due to a bezel area existing at an edge of each of the unit display devices. The bezel area is provided by side electrodes (or side wirings) for electrical connection between the components disposed on the upper portion of the substrate and the components disposed below the substrate.

Such a gap area gives a sense of disconnection and difference when a single image is displayed on the entire area of the multi-screen display device, thereby degrading the immersion of the image.

The display device according to an embodiment of the present invention can minimize the gap area by minimizing the thickness of the bezel area due to the side electrode. Also, the display device can improve the yield of the display device by simplifying the process of forming the side electrode and minimizing the defect rate during the process of forming the side electrode.

Hereinafter, a display device according to an embodiment of the present invention and a multi-screen display device using the same will be described in detail with reference to FIGS. 6 to 15.

FIG. 6 is a perspective view schematically illustrating a display device according to an embodiment of the present invention. FIG. 7 is a side view of an edge area of the display device according to the embodiment of FIG. 6.

First, when a direction is defined, a direction in which the semiconductor light emitting device assembly 610 is disposed with respect to the first substrate 601 is defined as an upper side. And, a direction in which the second substrate 602 is disposed with respect to the first substrate 601 is defined as a lower portion.

Referring to FIGS. 6 to 7, the display device 600 can include a first substrate 601 and a second substrate 602 formed under the first substrate 601. The area of the first substrate 601 and the area of the second substrate 602 can be the same.

For example, the first substrate 601 is a TFT substrate on which a TFT (thin film transistor) and wirings are formed, and the second substrate 602 can be a PCB on which circuits such as a timing controller, a memory, a voltage source for driving the semiconductor light emitting device assembly 610 or various wirings are formed or a PCB in which a driver for applying a signal to each of the gate wiring and the data wiring of the first substrate 601 is formed. In this case, a plurality of wiring electrodes 621 and 622 can be formed on the first substrate 601 and the second substrate 602.

However, depending on the embodiment, TFTs, wirings, and various circuits are formed on the second substrate 602, and the first substrate 601 can be implemented as a protective substrate for protecting the TFTs and wirings.

Also, according to an embodiment, the display device 600 can include only one substrate (eg, the first substrate 601). In this case, features related to the lower surface of the second substrate 602, which will be described later, can be equally applied to the lower surface of the first substrate 601.

A plurality of semiconductor light emitting device assemblies 610 can be arranged in an array form on the first substrate 601. In FIG. 6, only the plurality of semiconductor light emitting device assemblies 610 arranged in a line are illustrated for convenience of explanation, but a plurality of semiconductor light emitting device assemblies 610 forming a plurality of rows and columns can be arranged on the first substrate 601.

Each of the plurality of semiconductor light emitting device assemblies 610 functions as one pixel, and at least one semiconductor light emitting device 150 can be provided in the semiconductor light emitting device assembly 610. For example, when the pixel includes R (red), G (green), and B (blue) sub-pixels, a semiconductor light emitting device emitting red light, a semiconductor light emitting device emitting green light, and a semiconductor light emitting device emitting blue light can be provided in the semiconductor light emitting device assembly 610.

A wiring electrode 621 electrically connected to the plurality of semiconductor light emitting device assemblies 610 can be formed on the first substrate 601. In FIG. 6, only one wire electrode 621 is illustrated for convenience of explanation, but, the wiring electrode 621 can be formed of a plurality of wiring electrodes 621 based on the arrangement of the semiconductor light emitting device assembly 610.

Also, although not shown, a plurality of wiring electrodes (not shown) formed in a direction perpendicular to the wiring electrode 621 can be further formed on the first substrate 601. For example, when the first substrate 601 is a TFT substrate, the wiring electrode 621 is implemented as a data wiring or a gate wiring, etc. a wiring electrode formed perpendicular to the wiring electrode 621 can be implemented as a wiring different from that of the wiring electrode 621.

According to an embodiment, the wiring electrode 621 can correspond to a common electrode connected to the p electrode or the n electrode of each of the plurality of semiconductor light emitting devices 150.

On the other hand, the wiring electrode 621 formed on the first substrate 601 is electrically connected to a voltage source or circuit of the second substrate 602 to receive a signal related to driving of the plurality of semiconductor light emitting device assemblies 610 or to receive power.

To this end, the display device 600 according to an embodiment of the present invention can further include a plurality of electrode pads 631 and 632 formed on the edge area of the upper surface of the first substrate 601, and side electrodes 641 formed on the side surface of the display device 600. The plurality of electrode pads 631 and 632 and the side electrode 641 can be implemented with a conductive metal (Cu, Ag, etc.).

Each of the plurality of electrode pads 631 is connected to any one wiring electrode 621, and each of the plurality of electrode pads 632 can be connected to a wiring electrode (not shown) formed perpendicular to the wiring electrode 621.

The side electrode 641 can be formed on side surfaces of the first substrate 601 and the second substrate 602. One end of the side electrode 641 can be formed to contact the side surface of the electrode pad 631, and the other end can be connected to the wiring electrode 622 formed under the second substrate 602. In order for the other end to be connected to the wiring electrode 622, the side electrode 641 can be bent in the lower surface corner area of the second substrate 602 and can be formed to extend from the lower surface corner area of the second substrate 602 to the wiring electrode 622.

That is, the length of the side electrode 641 can be greater than the sum of the thickness T2 of the electrode pad 631, the thickness of the first substrate 601, and the thickness of the second substrate 602.

On the other hand, the electrode pad 631 is electrically connected to the side electrode 641 through the side, for a smooth electrical connection between the electrode pad 631 and the side electrode 641, it is necessary to ensure a sufficient contact area.

Based on this, referring to FIG. 7, the thickness T2 of the electrode pad 631 can be thicker than the thickness T1 of the wiring electrodes 621 and 622. As the thickness T2 increases, the contact area between the electrode pad 631 and the side electrode 641 increases, so a connection defect rate between the electrode pad 631 and the side electrode 641 can be minimized.

Meanwhile, in order to minimize the bezel area of the display device 600, the thickness T3 of the side electrode 641 can be thinner than the thickness T2 of the electrode pad 631. Also, according to an exemplary embodiment, the thickness T3 of the side electrode 641 can be equal to or thinner than the thickness T1 of the wiring electrodes 621 and 622.

FIGS. 8A to 8E are views for explaining an embodiment of a manufacturing process of the display device shown in FIG. 6;

Referring to FIG. 8A, a plurality of electrode pads 631 can be formed on the first substrate 601. The wiring electrode 621 described above with reference to FIG. 6 can be previously formed on the first substrate 601.

For example, the plurality of electrode pads 631 can be formed according to various techniques such as plating processing, printing of a conductive metal paste, electrode formation by aerosol deposition, inkjet printing, and the like.

The plurality of electrode pads 631 can be formed in an edge area (eg, an area including a corner) of the upper surface of the first substrate 601 to a predetermined thickness T2. As described above, the thickness T2 of the electrode pads 631 can be thicker than the thickness T1 of the wiring electrode 621 formed on the first substrate 601.

Referring to FIG. 8B, a plurality of semiconductor light emitting devices 150 can be assembled (transferred) on a first substrate 601. The plurality of semiconductor light emitting devices 150 can be transferred onto the first substrate 601 according to a known transfer technique. For example, the transfer technique can include various transfer techniques such as pick and place, stamp transfer, roll transfer, fluidic assembly, and laser transfer.

As the plurality of semiconductor light emitting devices 150 are transferred onto the first substrate 601, a plurality of semiconductor light emitting device assemblies 610 can be formed on the first substrate 601. As described above, each of the plurality of semiconductor light emitting device assemblies 610 can include at least one semiconductor light emitting device 150 based on the number of subpixels.

According to an embodiment, the plurality of electrode pads 631 can be formed after the semiconductor light emitting device assembly 610 is formed.

Referring to FIG. 8c, after the formation of the semiconductor light emitting device assembly 610, a second substrate 602 can be bonded (eg, bonded) to a lower portion of the first substrate 601, and a planarization layer 650 can be formed on the first substrate 601.

As shown in FIG. 8C, an inclined surface 602a can be formed on a lower edge area of the second substrate 602 according to an embodiment. The inclined surface 602a reduces a bending angle when the side electrode 641 is bent, thereby can minimize defects caused by bending, breaking, or separation of the side electrode 641 from the substrate.

According to an embodiment, the second substrate 602 can be bonded to the first substrate 601 at any point prior to the side electrode formation process of FIG. 8D.

The planarization layer 650 can be formed to a predetermined thickness to cover the upper surface of the first substrate 601 and the semiconductor light emitting device assembly 610. The planarization layer 650 can provide a flat surface on the upper portion of the display device 600, and can fix the position of the semiconductor light emitting device assembly 610.

Also, the planarization layer 650 can correspond to an encapsulation layer that protects the semiconductor light emitting device assembly 610.

The planarization layer 650 can be formed by a process such as molding or hot melt. For example, the planarization layer 650 can be implemented as a light-transmitting or fluorescent material, such as an acrylic resin, a polyimide resin, an epoxy resin, or a polyurethane resin.

On the other hand, according to the formation of the planarization layer 650, an upper surface of the electrode pad 631 can be covered by the planarization layer 650, and a side surface corresponding to the edge of the first substrate 601 among side surfaces of the electrode pad 631 can remain exposed.

Referring to FIG. 8D, after bonding of the second substrate 602 and formation of the planarization layer 650, a plurality of side electrodes 641 can be formed. The plurality of side electrodes 641 can be formed according to a technique similar to that of the electrode pad 631.

One end of each of the plurality of side electrodes 641 can be coupled (attached or bonded, etc.) to the exposed side surface of the electrode pad 631. Also, the other end of each of the plurality of side electrodes 641 can extend to the lower surface of the second substrate 602 and be connected to the wiring electrode 622 of the second substrate 602.

In order for the other end to be connected to the wiring electrode 622 formed on the lower surface of the second substrate 602, each of the plurality of side electrodes 641 can be bent in a lower edge area of the second substrate 602. As shown in FIG. 8C, when an inclined surface 641 is formed in a corner area of a lower surface of the second substrate 602, each of the plurality of side electrodes 641 can be bent along the inclined surface 641.

Referring to FIG. 8E, after formation of the side electrode 641, a film 660 can be formed on the upper surface of the planarization layer 650. The film 660 can include various optical films, such as a polarizing film, for preventing deterioration in quality (eg, black contrast degradation, etc.) when external light incident to the electrode present on the upper surface of the first substrate 601 is irradiated to the outside together with light emitted from the semiconductor light emitting devices 150.

Meanwhile, although not shown, after the formation of the side electrode 641 or the film 660, an insulating layer (insulating film, etc.) surrounding the outside of the side electrode 641 can be further formed. The insulating layer can be formed to surround the outside of the side electrode 641 to protect the side electrode 641.

Also, when the display devices 600 are tiled, the insulating layer enables electrical insulation between the side electrodes 641 of adjacent display devices. That is, the insulating layer constitutes the bezel area of the display device 600, and as the thickness of the side electrode 641 decreases, the thickness of the bezel area can also decrease.

FIGS. 9 to 11 are perspective views schematically illustrating a display device according to another exemplary embodiment of the present invention.

Referring to FIG. 9, the first substrate 901 and the second substrate 902 can be substantially the same as the first substrate 601 and the second substrate 602 shown in FIG. 6.

A plurality of semiconductor light emitting device assemblies 910 arranged in an array form and a wiring electrode 921 electrically connected to the plurality of semiconductor light emitting device assemblies 910 can be formed on the upper surface of the first substrate 901.

Also, in the edge area of the upper surface of the first substrate 901, a plurality of first electrode pads 931 and 932 connected to the wiring electrode 921 or a wiring electrode (not shown) formed in a direction perpendicular to the wiring electrode 921 can be formed. The plurality of first electrode pads 931 and 932 can have substantially the same configuration as the plurality of electrode pads 631 and 632 described above with reference to FIG. 6.

On the other hand, unlike the embodiment of FIG. 6, in the edge area of the lower surface of the second substrate 902, a plurality of second electrode pads 933 connected to the wiring electrode 922 (refer to FIG. 12) formed on the lower surface of the second substrate 902 can be formed. The plurality of second electrode pads 933 can be formed to have substantially the same shape as the plurality of first electrode pads 931.

Referring to FIG. 11, The display device 900 can further include a plurality of side electrodes 941 connected between the plurality of first electrode pads 931 and the plurality of second electrode pads 933. As described above with reference to FIG. 6, the electrode pads 931 to 933 and the side electrodes 941 can be formed of a conductive metal (Cu, Ag, etc.).

The plurality of side electrodes 941 can be formed on side surfaces of the first substrate 901 and the second substrate 902. One end of the side electrode 941 can be formed to contact the side surface of the first electrode pad 931, and the other end of the side electrode 941 can be formed to contact the side surface of the second electrode pad 933.

That is, the length of the side electrode 941 can be equal to or greater than the sum of the thickness T2 of the first electrode pad 931 (refer to FIG. 12), the thickness T2 of the second electrode pad 933, the thickness of the first substrate 901, and the thickness of the second substrate 902.

In this case, unlike the embodiment of FIG. 6, since the side electrode 941 can be implemented in the form of a flat plate without a bending area, the thickness of the side electrode 941 can be minimized.

According to an embodiment, as shown in FIG. 10, auxiliary electrode pads 934a or 934b can be further formed in the area including the lower surface corner of the first substrate 901 or the upper surface corner of the second substrate 902. The auxiliary electrode pad 934a or 934b can be formed to be substantially the same as the first electrode pad 931 and the second electrode pad 932.

The auxiliary electrode pad 934a or 934b can be connected to the side electrode 941 to improve electrical connectivity of the side electrode 941. Also, since the auxiliary electrode pad 934a or 934b is made of the same material as the side electrode 941, physical connectivity with the side electrode 941 can also be improved. [122] FIGS. 12 to 13 are side views of an edge area of the display device according to the embodiment of FIG. 9.

As described above in FIGS. 6 to 7, since the electrode pads 931 and 933 are electrically connected to the side electrode 941 through the side surface, a sufficient contact area should be secured for a smooth electrical connection between the electrode pads 931 and 933 and the side electrode 941.

Based on this, referring to FIG. 12, the thickness T2 of the first electrode pad 931 and the second electrode pad 933 can be thicker than the thickness T1 of the wiring electrodes 921 and 922. As the thickness T2 increases, the contact area between the electrode pads 931 and 933 and the side electrode 941 increases, so the connection defect rate between the electrode pads 931 and 933 and the side electrode 941 can be minimized.

According to an embodiment, the thickness of the first electrode pad 931 and the thickness of the second electrode pad 933 can be different from each other, but even in this case, each of the electrode pads 931 and 933 can be thicker than the thickness T1 of the wiring electrodes 921 and 922.

Also, in order to minimize the bezel area of the display device 900, the thickness T3 of the side electrode 941 can be thinner than the thickness T2 of the electrode pads 931 and 933. According to an embodiment, the thickness T3 of the side electrode 941 can be the same as or thinner than the thickness T1 of the wiring electrodes 921 and 922.

According to an embodiment, in order to maximize the contact area between the electrode pads 931 and 933 and the side electrode 941, as shown in FIG. 13, inclined surfaces 901*a* and 902*a* can be formed in the upper surface edge area of the first substrate 901 and/or the lower surface edge area of the second substrate 902. In this case, the thickness of the electrode pads 931 and 933 formed at the ends of the inclined surfaces 901*a* and 902*a* can be thicker than the thickness of the electrode pads 931 and 933 formed in the area other than the inclined surfaces 901*a* and 902*a*. That is, since the contact area between the electrode pads 931 and 933 and the side electrode 941 is maximized, physical/electrical connectivity between the electrode pads 931 and 933 and the side electrode 941 can be improved.

Although not shown, the inclined surface can also be formed on the lower surface of the first substrate 901 and/or the upper surface of the second substrate 902. In this case, since the thickness of the side electrode 941 in the area corresponding to the inclined surface can be thicker than that in other areas, the side electrode 941 can be more stably coupled to the side surfaces of the substrates 901 and 902.

FIGS. 14A to 14E are diagrams for explaining an embodiment of a manufacturing process of the display device shown in FIG. 9.

Referring to FIG. 14A, a plurality of first electrode pads 931 can be formed on an upper surface of the first substrate 901, and a plurality of second electrode pads 933 can be formed on a lower surface of the second substrate 902.

The plurality of first electrode pads 931 can be formed at a predetermined thickness T2 in an edge area (eg, an area including a corner) of the first substrate 901. Similarly, the plurality of second electrode pads 933 can be formed to have a predetermined thickness T2 in an edge area of a lower surface of the second substrate 902. As described above, the thickness T2 of the electrode pads 931 and 933 can be thicker than the thickness T1 of the wiring electrodes 921 and 922.

According to an embodiment, as shown in FIG. 10, a plurality of auxiliary electrode pads 934*a* or 934*b* can be further formed on the lower surface of the first substrate 901 or the upper surface of the second substrate 902.

Referring to FIG. 14B, a plurality of semiconductor light emitting devices 150 can be assembled (transferred) on a first substrate 901. The plurality of semiconductor light emitting devices 150 can be transferred onto the first substrate 901 according to a known transfer technique. For example, the transfer technique can include various transfer techniques such as pick and place, stamp transfer, roll transfer, fluidic assembly, and laser transfer.

As the plurality of semiconductor light emitting devices 150 are transferred onto the first substrate 901, a plurality of semiconductor light emitting device assemblies 910 can be formed on the first substrate 901. As described above, each of the plurality of semiconductor light emitting device assemblies 910 can include at least one semiconductor light emitting device 150 based on the number of subpixels.

According to an embodiment, the plurality of first electrode pads 931 can be formed after the semiconductor light emitting device assembly 910 is formed.

Referring to FIG. 14*c*, after the formation of the semiconductor light emitting device assembly 910, the second substrate 902 is coupled (adhesive, etc.) to the lower portion of the first substrate 901, and a planarization layer 950 can be formed on the first substrate 901.

The planarization layer 950 can be formed to a predetermined thickness to cover the upper surface of the first substrate 901 and the semiconductor light emitting device assembly 910.

Also, the planarization layer 950 can correspond to an encapsulation layer that protects the semiconductor light emitting device assembly 910.

This planarization layer 950 can be formed by a process such as molding or hot melt (hot melt). For example, the planarization layer 950 can be implemented as a light-transmitting or fluorescent material, such as an acrylic resin, a polyimide resin, an epoxy resin, or a polyurethane resin.

Meanwhile, according to the formation of the planarization layer 950, the upper surface of the first electrode pad 931 can be covered by the planarization layer 950, and among the side surfaces of the first electrode pad 931, a side surface corresponding to the edge of the first substrate 901 can remain exposed.

Referring to FIG. 14D, after bonding of the second substrate 902 and formation of the planarization layer 950, a plurality of side electrodes 941 can be formed. The plurality of side electrodes 941 can be formed according to a technique similar to that of the electrode pads 931 and 933.

One end of each of the plurality of side electrodes 941 can be connected to each other by bonding (attaching or bonding, etc.) to the exposed side surface of the first electrode pad 931. Also, the other end of each of the plurality of side electrodes 941 can be connected to each other by being coupled to the side surface of the second electrode pad 933 formed on the second substrate 902. That is, the length of each of the plurality of side electrodes 941 can be equal to or greater than the sum of the thickness of the first electrode pad 931, the thickness of the first substrate 901, the thickness of the second substrate 902 and the thickness of the second electrode pad 933.

In particular, the side surface of the first electrode pad 931, the side surface of the first substrate 901, the side surface of the second substrate 902, and the side surface of the second electrode pad 933 form the same surface, so each of the plurality of side electrodes 941 can be coupled to each other in a flat plate shape.

In the conventional case, since the side electrode is integrally formed from the upper surface of the first substrate 901 to the lower surface of the second substrate 902, the thickness of the side electrode cannot be sufficiently reduced to prevent connection failure due to separation or breakage due to bending of the side electrode. Accordingly, since the bezel area of the display device 900 cannot be reduced, a sense of difference occurs due to the gap area between the display devices when a screen is output through the multi-screen display devices.

According to an embodiment of the present invention, since the side electrode 941 can be implemented in the form of a flat plate, it is possible to minimize the thickness of the side electrode 941 and effectively prevent connection failure. Also, since the thickness of the side electrode 941 can be minimized, the size of the bezel area can also be effectively reduced.

Since the upper portion of the first substrate and the lower portion of the second substrate can be electrically connected only by forming the plate-shaped side electrode 941 between the first electrode pad 931 and the second electrode pad 933, it can effectively reduce the process difficulty.

Referring to FIG. 14E, after formation of the side electrode 941, a film 960 can be formed on the upper surface of the planarization layer 950. The film 960 can include various optical films, such as a polarizing film, for preventing deterioration in quality (eg, black contrast degradation, etc.) when external light incident to the electrode present on the upper surface of the first substrate 901 is irradiated to the outside together with light emitted from the semiconductor light emitting devices 150.

Meanwhile, although not shown, after the formation of the side electrode 941 or the film 960, an insulating layer (insulating film, etc.) surrounding the outside of the side electrode 941 can be further formed. The insulating layer can be formed to surround the outside of the side electrode 941 to protect the side electrode 941.

Also, when the display devices 900 are tiled, the insulating layer enables electrical insulation between the side electrodes 941 of adjacent display devices. That is, the insulating layer can constitute a bezel area of the display device 900.

FIG. 15 shows a multi-screen display device including a plurality of display devices according to an embodiment of the present invention.

Referring to FIG. 15, the multi-screen display device 1500 can be implemented in a tiled form in which a plurality of display devices 600a to 600d are tiled. Each of the plurality of display devices 600a to 600d can correspond to a display device implemented according to any one of the embodiments of FIGS. 6 to 14E. Each of the plurality of display devices 600a to 600d can correspond to a display device implemented according to any one of the embodiments of FIGS. 6 to 14E.

The multi-screen display device 1500 can be used as a large-area display device that provides one image through a plurality of display devices 600a to 600d. In this case, since the side bezel area of each of the plurality of display devices 600a to 600d according to the embodiment of the present invention can be minimized, the gap area with the adjacent display device can be effectively reduced.

As the gap area is reduced, the dark area generated by the gap area can be minimized or removed when an image is output, accordingly, an image with a minimized sense of disconnection can be displayed on the entire screen of the multi-screen display device 1500.

The above description is merely illustrative of the technical idea of the present invention, various modifications and variations will be possible without departing from the essential characteristics of the present invention by those skilled in the art to which the present invention pertains.

Therefore, the embodiments disclosed in the present invention are not intended to limit the technical spirit of the present invention, but to explain, and the scope of the technical spirit of the present invention is not limited by these embodiments.

The protection scope of the present invention should be interpreted by the following claims, and all technical ideas within the scope equivalent thereto should be construed as being included in the scope of the present invention.

The invention claimed is:

1. A display device comprising:
    a first substrate;
    a plurality of semiconductor light emitting devices arranged in an array form on an upper surface of the first substrate;
    a first wiring electrode disposed on the upper surface of the first substrate and electrically connected to the plurality of semiconductor light emitting devices;
    a first electrode pad disposed at an edge of the upper surface of the first substrate and connected to the first wiring electrode;
    a side electrode disposed at a side surface of the first substrate and having one end in contact with a side surface of the first electrode pad;
    a second substrate disposed under the first substrate; and
    an auxiliary electrode pad disposed at an edge of a lower surface of the first substrate or at an edge of an upper surface of the second substrate,
    wherein the side electrode contacts a side surface of the auxiliary electrode pad, and
    wherein a thickness of the first electrode pad is greater than a thickness of the first wiring electrode.

2. The display device according to claim 1, wherein a thickness of the side electrode is less than the thickness of the first electrode pad.

3. The display device according to claim 2, wherein the thickness of the side electrode is equal to or less than the thickness of the first wiring electrode.

4. The display device according to claim 1, further comprising a second wiring electrode disposed at the lower surface of the first substrate,
    wherein another end of the side electrode is connected to the second wiring electrode, and
    wherein the side electrode comprises a bent portion between the one end and the another end of the side electrode to correspond to a lower edge of the first substrate.

5. The display device according to claim 1, further comprising:
    a second wiring electrode disposed at a lower surface of the second substrate,
    wherein another end of the side electrode is connected to the second wiring electrode, and
    wherein the side electrode comprises a bent portion between the one end and the another end of the side electrode to correspond to a lower edge of the second substrate.

6. The display device according to claim 5, wherein the second substrate comprises an inclined surface between a side surface and the lower surface of the second substrate, and wherein the bent portion of the side electrode is formed to correspond to the inclined surface.

7. The display device according to claim 1, further comprising:

a second wiring electrode disposed at a lower surface of the second substrate; and a second electrode pad disposed at an edge of the second substrate and connected between the second wiring electrode and the side electrode, and wherein a thickness of the second electrode pad is greater than a thickness of the second wiring electrode.

8. The display device according to claim 7, wherein another end of the side electrode contacts a side surface of the second electrode pad.

9. The display device according to claim 8, wherein the side electrode has a flat plate shape.

10. The display device according to claim 9, wherein a length of the side electrode is equal to or greater than a sum of a thickness of the first electrode pad, a thickness of the first substrate, a thickness of the second substrate, and the thickness of the second electrode pad.

11. The display device according to claim 7, wherein a thickness of the side electrode is less than a thickness of the first electrode pad and the thickness of the second electrode pad.

12. A multi-screen display device comprising a plurality of display devices in a tiled arrangement, wherein each of the plurality of display devices comprises the display device according to claim 1.

13. A method of manufacturing a display device, the method comprising:

forming a first wiring electrode at an upper surface of a first substrate to be connected to a plurality of semiconductor light emitting devices arranged in an array form on the upper surface;

forming a first electrode pad connected to the first wiring electrode at an edge of the upper surface of the first substrate to be connected to the first wiring electrode;

forming a side electrode at a side surface of the first substrate to have one end in contact with a side surface of the first electrode pad;

bonding a second substrate to a lower portion of the first substrate; and forming a second wiring electrode at a lower surface of the second substrate, wherein an upper surface of the side electrode and an upper surface of the first electrode pad are positioned at substantially the same height, wherein a thickness of the first electrode pad is greater than a thickness of the first wiring electrode, wherein forming the side electrode further comprises forming the side electrode to have another end of the side electrode connected to the second wiring electrode, and wherein the side electrode comprises a bent portion between the one end and the another end of the side electrode to correspond to a lower edge of the second substrate.

14. The method of claim 13, wherein a thickness of the side electrode is less than a thickness of the first electrode pad.

15. The method of claim 13, further comprising:

forming a second electrode pad connected to the second wiring electrode at an edge of the lower surface of the second substrate, wherein the side electrode is formed such that another end of the side electrode contacts a side surface of the second electrode pad.

16. The method of claim 15, wherein a length of the side electrode is equal to or greater than a sum of the thickness of the first electrode pad, a thickness of the first substrate, a thickness of the second substrate, and a thickness of the second electrode pad.

17. The method of claim 16, wherein a thickness of the side electrode is less than the thickness of the first electrode pad and the thickness of the second electrode pad.

* * * * *